(12) United States Patent
Agarwal

(10) Patent No.: US 6,638,809 B2
(45) Date of Patent: Oct. 28, 2003

(54) METHODS OF FORMING SEMICONDUCTOR CIRCUIT CONSTRUCTIONS AND CAPACITOR CONSTRUCTIONS

(75) Inventor: Vishnu K. Agarwal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/894,320

(22) Filed: Jun. 27, 2001

(65) Prior Publication Data
US 2001/0039085 A1 Nov. 8, 2001

Related U.S. Application Data

(63) Continuation of application No. 09/251,104, filed on Feb. 16, 1999, now Pat. No. 6,387,748.

(51) Int. Cl.[7] .......................................... H01L 21/8242
(52) U.S. Cl. ...................................... 438/239; 438/396
(58) Field of Search ................................. 438/398, 399, 438/340, 3, 643, 396, 239, 240, 261, 253

(56) References Cited

U.S. PATENT DOCUMENTS

| 4,796,077 | A | | 1/1989 | Takeda et al. | |
|---|---|---|---|---|---|
| 5,170,242 | A | * | 12/1992 | Stevens et al. | 257/617 |
| 5,346,600 | A | | 9/1994 | Nieh et al. | |
| 5,508,953 | A | * | 4/1996 | Fukuda et al. | 365/145 |
| 5,571,572 | A | | 11/1996 | Sandhu | |
| 5,654,222 | A | | 8/1997 | Sandhu et al. | |
| 5,661,115 | A | | 8/1997 | Sandhu | |
| 5,663,088 | A | * | 9/1997 | Sandhu et al. | 438/396 |
| 5,747,116 | A | | 5/1998 | Sharan et al. | |
| 5,760,474 | A | | 6/1998 | Schuele | |
| 5,773,363 | A | | 6/1998 | Derderian et al. | |
| 5,851,896 | A | | 12/1998 | Summerfelt | |
| 5,910,880 | A | | 6/1999 | DeBoer et al. | |
| 5,977,636 | A | | 11/1999 | Sharan | |
| 6,017,789 | A | | 1/2000 | Sandhu et al. | |
| 6,025,269 | A | | 2/2000 | Sandhu | |
| 6,071,560 | A | * | 6/2000 | Braendle et al. | 427/249.19 |
| 6,096,597 | A | | 8/2000 | Tsu et al. | |
| 6,110,571 | A | | 8/2000 | Yahinuma et al. | |
| 6,133,636 | A | * | 10/2000 | Akram et al. | 257/761 |
| 6,171,970 | B1 | | 1/2001 | Xing et al. | |
| 6,211,035 | B1 | | 4/2001 | Moise et al. | |
| 6,218,258 | B1 | * | 4/2001 | Joo | 438/396 |
| 6,238,932 | B1 | * | 5/2001 | Aoki et al. | 438/240 |

FOREIGN PATENT DOCUMENTS

| EP | 0725428 | * | 8/1996 | ....... H01L/21/3205 |
|---|---|---|---|---|
| EP | 0847083 | * | 6/1998 | ....... H01L/21/3205 |
| GB | 2320725 | | 12/1996 | |

* cited by examiner

Primary Examiner—W. David Coleman
Assistant Examiner—Brook Kebede
(74) Attorney, Agent, or Firm—Wells, St. John, P.S.

(57) ABSTRACT

In one aspect, the invention encompasses a semiconductor circuit construction including a material which comprises Q, R, S and B. In such construction, Q comprises one or more refractory metals, R is selected from the group consisting of one or more of tungsten, aluminum and silicon, S is selected from the group consisting of one or more of nitrogen and oxygen, and B is boron. Also, in such construction R and Q do not comprise a common element. In another aspect, the invention encompasses a method of forming a capacitor. A first capacitor electrode is formed, a diffusion barrier layer is formed proximate the first capacitor electrode, and a dielectric layer is formed to be separated from the first capacitor electrode by the diffusion barrier layer. A second capacitor electrode is formed to be separated from the first electrode by the dielectric layer. The diffusion barrier layer comprises $Q_xR_yS_z$ wherein Q is a refractory metal, R is selected from the group consisting of tungsten, aluminum and silicon, and S is selected from the group consisting of nitrogen and oxygen; provided that R is not the same element as Q. The formation of the diffusion barrier layer comprises depositing the $Q_xR_yS_z$ and exposing the $Q_xR_yS_z$ to a nitrogen-containing plasma.

12 Claims, 3 Drawing Sheets

METHODS OF FORMING SEMICONDUCTOR CIRCUIT CONSTRUCTIONS AND CAPACITOR CONSTRUCTIONS

This patent resulted from a continuation application of U.S. patent application Ser. No. 09/251,104 filed on Feb. 16, 1999 now U.S. Pat. No. 6,387,748.

TECHNICAL FIELD

The invention pertains to semiconductor circuit constructions, such as, for example capacitor constructions, and to methods of forming semiconductor circuit constructions. In particular aspects, the invention pertains to diffusion barrier layers for use in capacitor constructions.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs is on the order of 0.25 micron, and conventional dielectrics such as $SiO_2$ and $Si_3N_4$ might not be suitable because of small dielectric constants.

Some dielectric materials considered to be promising as cell dielectrics layers are $Ta_2O_5$, barium strontium titanate (BST) and lead zirconate titanate (PZT). Such materials can be formed by, for example, chemical vapor deposition (CVD). The dielectric constant of $Ta_2O_5$, BST and PZT materials can be quite high. For instance, the dielectric constant of $Ta_2O_5$ is approximately three times that of $Si_3N_4$. Proposed prior art capacitor constructions include the use of $Ta_2O_5$, PZT or BST as a capacitor dielectric layer, in combination with an overlying predominately crystalline TiN electrode or other layer. However, diffusion relative to the $Ta_2O_5$, PZT or BST layer can be problematic in the resultant capacitor construction. For example, tantalum and oxygen can undesirably out-diffuse from a $Ta_2O_5$-comprising dielectric layer; lead, zirconium, tantalum or oxygen can out-diffuse from a PZT-comprising dielectric; and one or more of barium, strontium and oxygen can undesirably out-diffuse from a BST-comprising dielectric layer. Further, materials from the adjacent conductive capacitor plates can diffuse into the $Ta_2O_5$, PZT or BST dielectric layer. The above-discussed diffusion into and out of $Ta_2O_5$, PZT and BST dielectric layers can cause electrical and other properties of the layers and the surrounding materials to be adversely affected in a less than predictable or an uncontrollable manner.

SUMMARY OF THE INVENTION

In one aspect, the invention encompasses a semiconductor circuit construction including a material which comprises Q, R, S and B. In such construction, Q comprises one or more refractory metals, R is selected from the group consisting of one or more of tungsten, aluminum and silicon, S is selected from the group consisting of one or more of nitrogen and oxygen, and B is boron. Also, in such construction R includes at least one element that is not included by Q.

In another aspect, the invention encompasses a method of forming a capacitor. A first capacitor electrode is formed, a diffusion barrier layer is formed proximate the first capacitor electrode, and a dielectric layer is formed to be separated from the first capacitor electrode by the diffusion barrier layer. A second capacitor electrode is formed to be separated from the first electrode by the dielectric layer. The diffusion barrier layer comprises $Q_xR_yS_z$ wherein Q is a refractory metal, R is selected from the group consisting of tungsten, aluminum and silicon, and S is selected from the group consisting of nitrogen and oxygen; provided that R includes at least one element that is not included by Q. The formation of the diffusion barrier layer comprises depositing the $Q_xR_yS_z$ and exposing the $Q_xR_yS_z$ to a nitrogen-containing plasma.

In yet another aspect, the invention encompasses a capacitor construction having a first capacitor electrode comprising $Q_xR_yS_z(B)$. In such construction, Q is a refractory metal; R is selected from the group consisting of tungsten, aluminum and silicon; S is nitrogen; and B is boron. In such construction, R includes at least one element that is not included by Q.

In yet another aspect, the invention encompasses a capacitor construction comprising a polysilicon-comprising interconnect, a diffusion barrier layer against the polysilicon-comprising interconnect, and a first capacitor electrode separated from the polysilicon-comprising interconnect by the diffusion barrier layer. The diffusion barrier layer comprises $Q_xR_yS_z$; wherein Q is a refractory metal, R is selected from the group consisting of tungsten, aluminum and silicon, and S is selected from the group consisting of nitrogen and oxygen. The capacitor construction further comprises a dielectric layer proximate the first capacitor electrode, and a second capacitor electrode separated from the first electrode by the dielectric layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
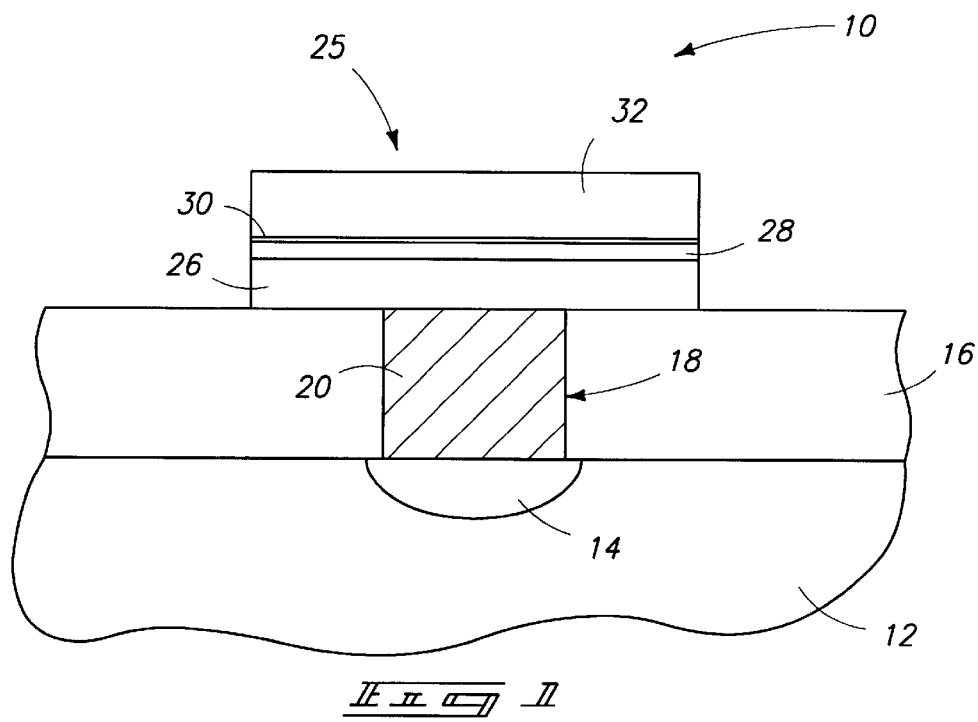
FIG. 1 is a fragmentary, diagrammatic, sectional view of a semiconductor wafer fragment in accordance with the invention.

Structures and methods encompassed by the present invention are described with reference to FIGS. 1–3. Referring to FIG. 1, a semiconductor wafer fragment 10 illustrates a capacitor construction 25 encompassed by the present invention. Wafer fragment 10 comprises a substrate 12 having a conductive diffusion area 14 formed therein. Substrate 12 can comprise, for example, monocrystalline silicon. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulating layer 16, typically borophosphosilicate glass (BPSG), is provided over substrate 12, with a contact opening 18 provided therein to diffusion area 14. A conductive plug 20 fills contact opening 18 to form an electrical interconnect, with the material of plug 20 and oxide layer 16 having been planarized as shown. Plug 20 can comprise any suitable conductive material, such as, for example, tungsten or conductively doped polysilicon. Capacitor construction 25 is provided atop layer 16 and plug 20, and electrically connected to node 14 through plug 20.

Capacitor construction 25 comprises a first capacitor electrode 26 which has been provided and patterned over plug 20. An example and preferred material is conductively doped polysilicon, provided to a thickness of about 1,000 Angstroms for a 256 Mb density. A capacitor dielectric layer 28 is provided over first capacitor electrode 26. Capacitor dielectric layer 28 can comprise, for example, one or both of silicon oxide and silicon nitride. Alternatively, capacitor dielectric layer 28 can comprise $Ta_2O_5$, BST or PZT. An exemplary process for depositing a layer 28 comprising $Ta_2O_5$ is low pressure chemical vapor deposition at 450° C. using $Ta(OC_2H_5)_5$ and oxygen as precursors. $Ta(OC_2H_5)_5$ can be vaporized at 170° C., and introduced into a reactor chamber using argon or another suitable carrier gas. Subsequently, densification can occur by rapid thermal annealing in a dry oxygen atmosphere at a temperature ranging from 700° C. to 900° C. Preferably, if first capacitor electrode 26 comprises polysilicon, a surface of the polysilicon is cleaned by an in situ HF dip prior to provision of $Ta_2O_5$. Rapid thermal nitrogen treatment can also be carried out immediately prior to $Ta_2O_5$ deposition, such as at 900° C. for 60 seconds in $NH_3$. An exemplary thickness for layer 28 in accordance with 256 Mb integration is 100 Å.

A diffusion barrier layer 30 is provided over dielectric layer 28. In accordance with the present invention, diffusion barrier layer 30 comprises Q, R and S; wherein Q comprises one or more refractory metals, R is selected from the group consisting of one or more of tungsten, aluminum and silicon, and S is selected from the group consisting of one or more of nitrogen and oxygen. The element(s) identified by R include at least one element different than the element(s) identified by Q such that a material represent as QRS is at least a ternary complex. Exemplary refractory metals that can be utilized for Q are metals selected from the group consisting of titanium, tantalum and tungsten. In particular embodiments, Q, R and S are single elements comprised by a compound having the stoichiometry $Q_xR_yS_z$. The stoichiometry of $Q_xR_yS_z$ can be such that z equals 1−(x+y). A conductivity of barrier layer 30 can be adjusted by varying the amount of oxygen and nitrogen for S in compounds comprising Q, R and S. Specifically, if S is nitrogen, the compound $Q_xR_yS_z$ is electrically conductive. If S is a mixture of nitrogen and oxygen, compounds comprising Q, R and S are less electrically conductive than if S consists of nitrogen. Alternatively, if S consists of oxygen, the compound $Q_xR_yS_z$ is electrically insulative (or highly resistive).

Barrier layer 30 can be formed by, for example, chemical vapor deposition. For instance, a method of forming $Ti_xAl_yN_z$ is chemical vapor deposition utilizing TDMAT (Ti[N(CH$_3$)$_2$]$_4$) as a source of titanium, dimethylaminealane as a source of aluminum, and ammonia as a source of nitrogen. The precursor gases are supplied to a substrate which has been heated to a temperature in the range of from approximately 250° C. to about 550° C. to deposit $Ti_xAl_yN_z$ on the substrate.

After the deposition of $Q_xR_yS_z$ for barrier layer 30, the $Q_xR_yS_z$ is preferably exposed to a nitrogen-containing plasma to densify the material of layer 30, as well as to reduce carbon incorporated within the material of layer 30. Carbon can become incorporated within the material of layer 30 during chemical vapor deposition if carbon-containing precursors are utilized. The carbon within layer 30 can adversely affect stability of material 30, reducing its ability to function as a barrier layer. Also, in applications in which material 30 is to be conductive, carbon incorporated within the material can adversely increase a resistance of the material. Three different embodiment methods for exposing layer 30 to a nitrogen-containing plasma are discussed below. However, it is to be understood that the discussed methods are provided for exemplary purposes, and not intended to limit the invention except as specifically recited in the claims that follow. Accordingly, it is to be understood that the invention encompasses other embodiments for exposing a material of layer 30 to a nitrogen-containing plasma in addition to those specifically described below.

A first embodiment method for exposing layer 30 to a nitrogen-containing plasma is to place substrate 10 within a reaction chamber, and form a nitrogen-containing plasma from $N_2$ and $H_2$ within the chamber. An exemplary plasma mixture within the chamber comprises from about 10% to about 80% $N_2$, and from about 20% to about 90% $H_2$ (by volume). A pressure within the chamber is maintained at from about 100 mTorr to about 100 Torr, and a temperature of the exposed layer 30 is maintained at from about 100° C. to about 600° C. In addition to the $N_2$ and $H_2$, the plasma mixture can further comprise greater than 0% and less than or equal to about 40% (by volume) argon. Layer 30 is preferably exposed to the plasma for a time of from about 20 seconds to about 180 seconds.

A second embodiment method for exposing layer 30 to a nitrogen-containing plasma is to place layer 30 within a reaction chamber in which a nitrogen-containing plasma is formed from $NH_3$. A temperature of the exposed layer 30 is maintained at from about 100° C. to about 600° C. within the reaction chamber, and a pressure within the chamber is maintained at from about 100 mTorr to about 100 Torr. An exemplary exposure time is from about 20 seconds to about 180 seconds. In addition to the $NH_3$, the plasma mixture can further comprise greater than 0% and less than or equal to about 40% (by volume) argon.

A third embodiment method of exposing layer 30 to a nitrogen-containing plasma is to expose layer 30 to a plasma formed from $NH_3$, in a reaction chamber under conditions wherein a pressure within the chamber is maintained at from about 1 Torr to about 8 atmospheres, and a temperature of the exposed layer 30 is maintained at greater than or equal to about 500° C. An exemplary time for such exposure is from about 1 minute to about 60 minutes.

In addition to the $Q_xR_yS_z$, layer 30 can further comprise boron, and can thus comprise a formula of $Q_xR_yS_z(B)$, wherein B indicates boron. The stoichiometry of $Q_xR_yS_z(B)$ can be such that z equals 1−(x+y). Incorporation of boron into layer 30 can alleviate oxygen diffusion through layer 30 beyond the extent to which oxygen diffusion is alleviated by $Q_xR_yS_z$ without boron. Additionally, the incorporation of boron into the $Q_xR_yS_z$ of layer 30 can reduce the reactivity of the $Q_xR_yS_z$ with oxygen. Further, the incorporation of boron into the $Q_xR_yS_z$ of layer 30 can reduce diffusion of halogen atoms (for instance F and Cl) through layer 30. Such halogen atoms can be generated as materials (such as for example, $WN_x$, W or TiN) are deposited proximate or against layer 30.

Several exemplary methods are described below for providing boron within layer 30. However, it is to be understood that the invention is not limited to such exemplary methods, except to the extent that such are specifically recited in the claims that follow.

In a first exemplary method for incorporating boron into layer 30, the $Q_xR_yS_z$ of layer 30 is exposed to $B_2H_6$ at temperature of from about 200° C. to about 600° C., and a pressure of from about 1 Torr to about 5 atmospheres (preferably from about 500 Torr to about 1 atmosphere). The $B_2H_6$ is preferably mixed with argon in the ratio of 5% $B_2H_6$ to 95% argon (wherein the percentages are by volume). The $Q_xR_yS_z$ is exposed for a time of from about 10 seconds to about 60 minutes to convert the $Q_xR_yS_z$ to $Q_xR_yS_z(B)$, with the B being present at a concentration of from about 0.01% to about 4% (atomic percent).

In alternative embodiments, boron can be incorporated into the $Q_xR_yS_z$ of layer 30 utilizing the conditions described above, and further comprising exposing one or both of the $B_2H_6$ and $Q_xR_yS_z$ to a plasma during incorporation of the boron into layer 30. The plasma can comprise, for example, a nitrogen-containing plasma such as the exemplary plasmas described above. Accordingly, the incorporation of boron into layer 30 can occur simultaneously with the exposure of $Q_xR_yS_z$ to a nitrogen-containing plasma. Alternatively, incorporation of boron into layer 30 can occur before or after exposure of the $Q_xR_yS_z$ to a nitrogen-containing plasma.

In another embodiment method for incorporating boron into the $Q_xR_yS_z$ of layer 30, substrate 10 can be exposed to $B_2H_6$ at a temperature of from about 200° C. to about 600° C., and a pressure of from about 1 Torr to about 5 atmospheres (preferably from about 500 Torr to about 1 atmosphere), and further with the $B_2H_6$ exposed to ultraviolet light. The ultraviolet light can encompass any wavelength in the ultraviolet range, and can be generated with a halogen lamp at a power of from about 100 watts to about 4 kilowatts.

After formation of barrier layer 30, a second capacitor electrode 32 is formed over barrier layer 30 to complete construction of capacitor 25. Second capacitor electrode 32 can comprise constructions similar to those discussed above regarding first capacitor electrode 26, and can accordingly comprise, for example, conductively doped polysilicon. Diffusion barrier layer 30 preferably prevents components (such as, for example, tantalum or oxygen) from diffusing from dielectric material 28 and into electrode 32. If, for example, oxygen diffuses into a silicon-comprising electrode 32, it can undesirably form $SiO_2$, which will significantly reduce the capacitance of capacitor 25. Diffusion barrier layer 30 can also prevent diffusion of silicon from metal electrode 32 to dielectric layer 28.

In the discussion above, barrier layer 30 is described as a separate layer from either electrode 32 or barrier layer 28. An alternative description of barrier layer 30 is as a portion of either electrode 32 or dielectric 28. Specifically, if barrier layer 30 is formed to be conductive (i.e., if S is nitrogen) then barrier layer 30 can be considered to be a portion of conductive electrode 32. In other words, electrode 32 can be considered to comprise two distinct layers, with one of the layers comprising the $Q_xR_yS_z$, and the other layer not comprising $Q_xR_yS_z$. In other embodiments wherein barrier layer 30 is insulative (i.e., embodiments in which S is oxygen), barrier layer 30 can be considered part of dielectric material 28. In such embodiments, it can be considered that dielectric material 28 comprises two distinct layers, with one of the layers comprising $Q_xR_yS_z$, and the other layer not comprising $Q_xR_yS_z$.

Figure 2:
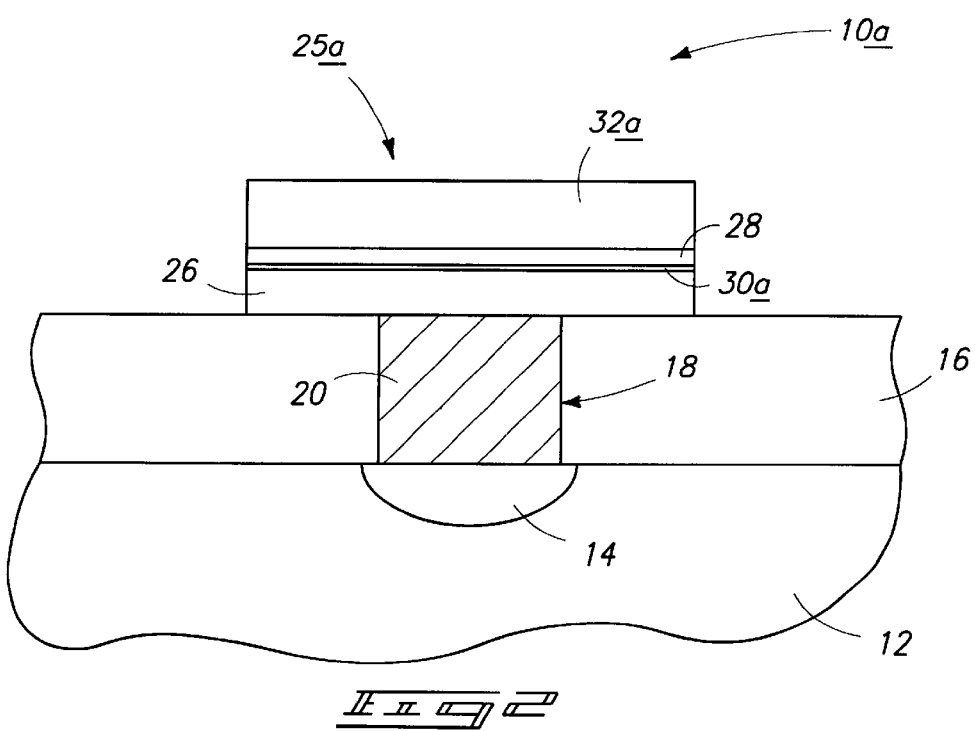
FIG. 2 is a diagrammatic, sectional view of an alternate embodiment semiconductor wafer fragment in accordance with the invention.

FIG. 2 illustrates an alternate embodiment capacitor construction and method in accordance with the invention. Like numerals from FIG. 1 have been utilized where appropriate, with differences indicated by the suffix "a". Wafer fragment 10a comprises a capacitor construction 25a differing from the first described embodiment in provision of a barrier layer 30a between first electrode 26 and dielectric layer 28, rather than between dielectric layer 28 and second capacitor electrode 32. Barrier layer 30a can comprise constructions identical to those discussed above with reference to FIG. 1.

Figure 3:
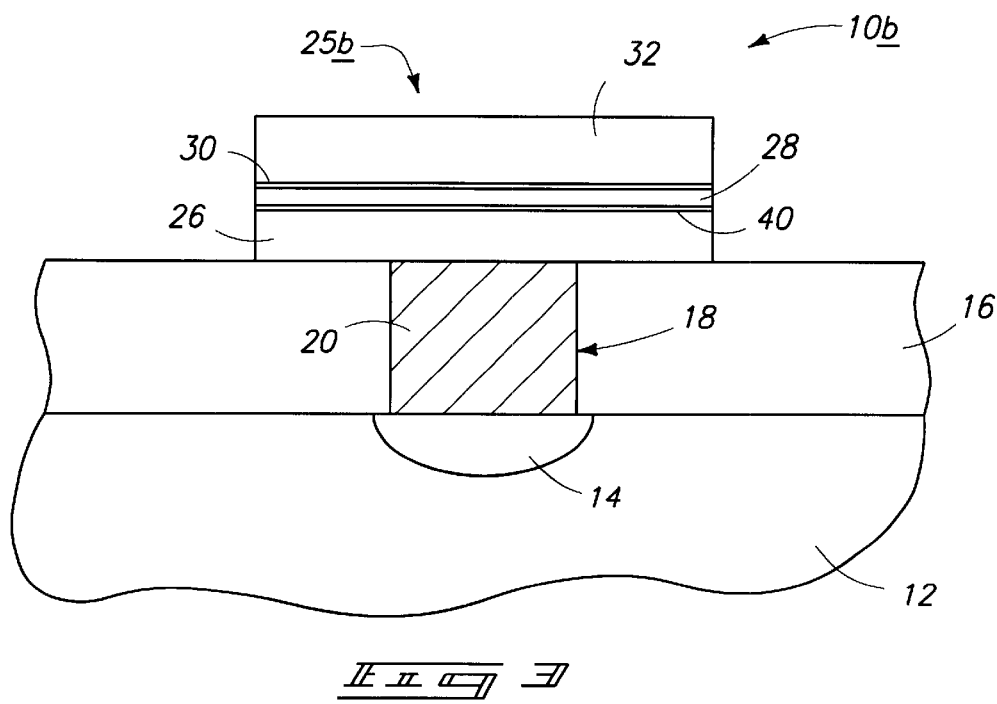
FIG. 3 is a diagrammatic, sectional view of a second alternate embodiment semiconductor wafer fragment in accordance with the invention.

FIG. 3 illustrates yet another alternate embodiment capacitor construction and method. Like numerals from FIG. 1 are utilized where appropriate, with differences being indicated by the suffix "b", or by different numerals. Wafer fragment 10b includes a capacitor construction 25b having the first and second capacitor plates 26 and 32, respectively, of the first described embodiment. However, wafer fragment 10b differs from wafer fragment 10 of the first described embodiment, in that wafer fragment 10b comprises a second barrier layer 40 in addition to the barrier layer 30. Barrier layer 40 is provided between first capacitor electrode 26 and dielectric layer 28, whereas barrier layer 30 is between second capacitor electrode 32 and dielectric layer 28. Barrier layer 40 can be formed by methods identical to those discussed above with reference to FIG. 1 for formation of barrier layer 30.

Figure 4:
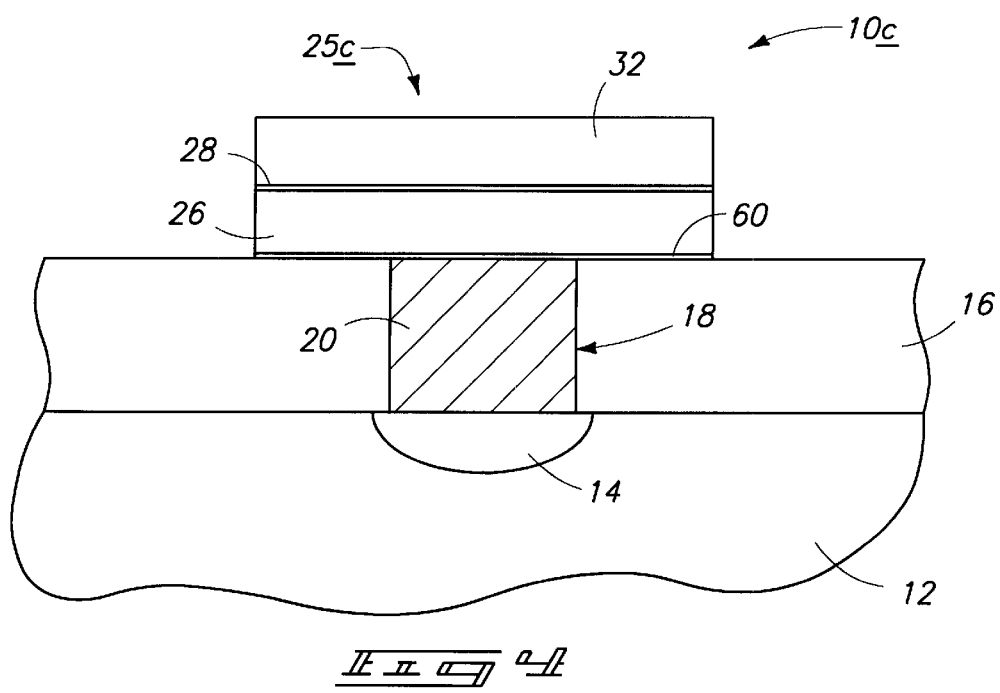
FIG. 4 is a diagrammatic, sectional view of a third alternate embodiment semiconductor wafer fragment in accordance with the invention.

FIG. 4 illustrates another embodiment capacitor construction and method. Like numerals from FIG. 1 are utilized where appropriate, with differences indicated by the suffix "c", or by different numerals. Wafer fragment 10c includes a capacitor construction 25c having first and second capacitor plates 26 and 32, like those of the first-described embodiment. Wafer fragment 10c further comprises a substrate 12 having an electrical node location 14 provided therein, and an electrical interconnect 20 and extending from node location 14 to first capacitor plate 26. Wafer fragment 10c differs from wafer fragment 10 (FIG. 1) of the first embodiment in that wafer fragment 10c comprises a diffusion barrier layer 60 between interconnect 20 and first capacitor plate 26. In exemplary embodiments, interconnect 20 will comprise or consist essentially of conductively doped polysilicon, and capacitor plates 26 and 32 will comprise non-polysilicon materials, such as, for example, W, $WN_x$, Pt, Ru, Ir, $RuO_x$, $IrO_x$, or titanium nitride. Further, in such exemplary embodiments, dielectric layer 28 will comprise one or more of $Ta_2O_5$, BST, or PZT. As discussed above in the "Background" section of this disclosure, components of such dielectric materials can problematically diffuse outwardly from the dielectric materials and into other materials proximate the dielectric materials. It is found that diffusion into non-polysilicon materials can be less problematic than diffusion into polysilicon materials. Accordingly, the placement of diffusion barrier layer 60 between a polysilicon-comprising interconnect 20 and first capacitor plate 26 can alleviate or prevent the problematic diffusion of components from dielectric layer 28 into the polysilicon-comprising interconnect. Diffusion of components from dielectric material 28 can be further alleviated utilizing a diffusion barrier layer provided between one or both of the capacitor electrodes (26 and 32) and dielectric barrier layer 28, utilizing methodologies discussed above with reference to FIGS. 1–3. Accordingly, the invention encompasses other embodiments (not shown) wherein diffusion barrier layers are provided both between interconnect 20 and first capacitor electrode 26, and between one or both of electrodes 26 and 32 and barrier layer 28.

Barrier layer 60 can be formed by methods identical to those discussed above with reference to FIG. 1 for formation of barrier layer 30.

Figure 5:
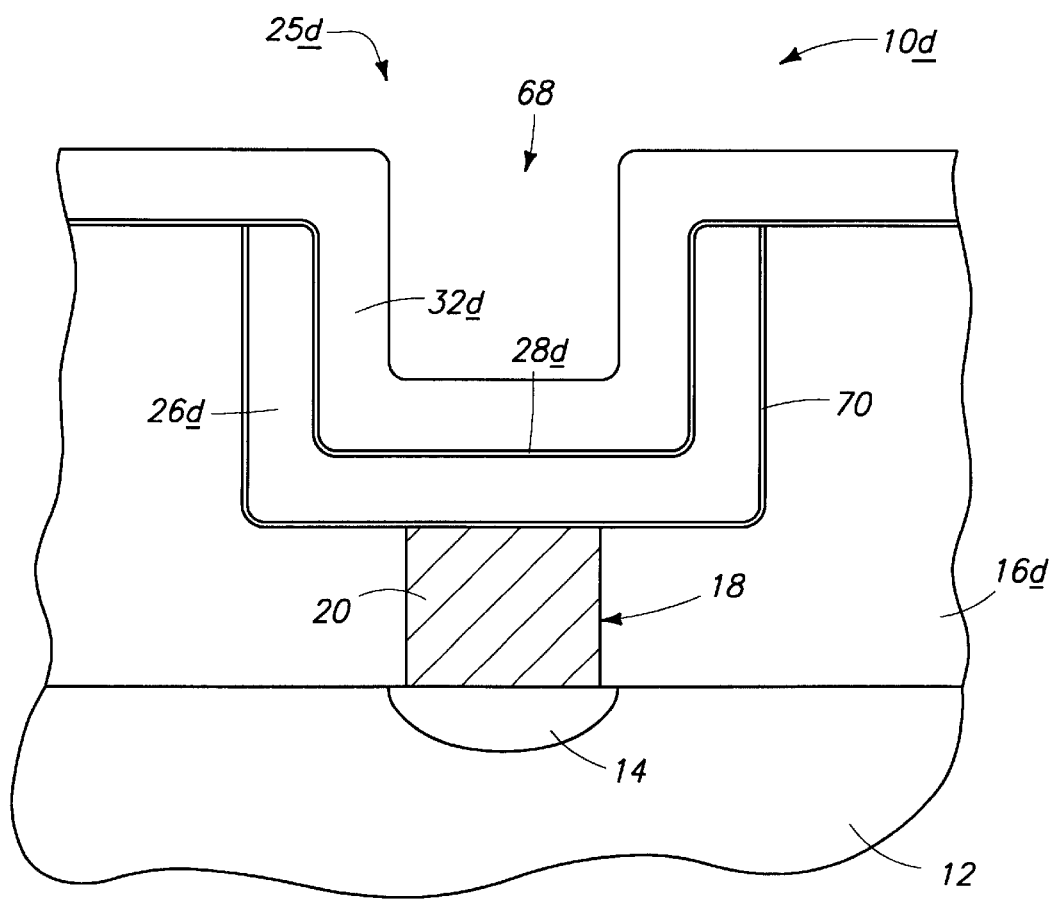
FIG. 5 is a diagrammatic, sectional view of a fourth alternate embodiment semiconductor wafer fragment in accordance with the invention.

Referring to FIG. 5, another alternate embodiment capacitor construction and method are described. Like numerals from FIG. 1 are utilized where appropriate, with differences being indicated by the suffix "d" or by different numerals. Wafer fragment 10d includes a capacitor construction 25d that is formed into a container-type shape. Specifically, wafer fragment 10d comprises an insulative material 16d having a widened opening 68 provided therein and over interconnect 20. Widened opening 68 can be formed by conventional methods. Capacitor construction 25d is formed within widened opening 68, and comprises a diffusion barrier layer 70, a first capacitor electrode 26d, a dielectric layer 28d, and a second capacitor electrode 32d. Diffusion barrier layer 70, first capacitor electrode 26d, dielectric layer 28d, and second capacitor electrode 32d can comprise materials identical to those discussed above with reference to FIG. 1 as being incorporated within diffusion barrier layer 30, first capacitor electrode 26, dielectric layer 28 and second capacitor electrode 32, respectively. Capacitor 25d, like the above-discussed capacitor 25c (FIG. 4) comprises a diffusion barrier layer between a first capacitor electrode and a conductive interconnect. Accordingly, the descriptions of the utility of diffusion barrier layer 60 (FIG. 4) apply also to diffusion barrier layer 70 of FIG. 5.

In the above-described embodiments, the materials $Q_xR_yS_z$ and $Q_xR_yS_z(B)$ are described with application to capacitor constructions. It is to be understood, however, that the shown capacitor constructions are merely exemplary semiconductor circuit structures which can incorporate the material $Q_xR_yS_z(B)$. Accordingly, this disclosure is not to be limited to incorporation of such material into capacitor constructions, except to the extent that such is expressly indicated in the claims that follow. Other semiconductor circuit structures that can incorporate $Q_xR_yS_z$ and/or $Q_xR_yS_z(B)$ are, for example, resistors. A level of resistance can be adjusted by adjusting the relative concentrations of Q, R, S and/or B. For instance, if S is nitrogen, the resistors will have a higher conductance than if S is oxygen, or a mixture of oxygen and nitrogen. The level of resistance can also be adjusted by treating the $Q_xR_yS_z$ and/or $Q_xR_yS_z(B)$ with a nitrogen-containing plasma. Longer plasma treatments can result in $Q_xR_yS_z$ and/or $Q_xR_yS_z(B)$ materials having less carbon, and thus lower resistance.

Another utilization of $Q_xR_yS_z$ and $Q_xR_yS_z(B)$ materials of the present invention is as barrier layers between, for example, insulative materials (such as, for example, BPSG or silicon dioxide) and metal-comprising conductive materials of, for example, conductive lines. Such barrier layers can alleviate reaction of, for example, oxygen from the insulative materials with metals of the conductive lines. As oxidation of the metals of the conductive lines can reduce conductance, the barrier layers can improve performance of conductive lines relative to lines formed directly against insulative materials.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductor circuit construction, comprising forming a material which comprises Q, R, S and B; wherein Q comprises one or more refractory metals; R is selected from the group consisting of one or more of tungsten, aluminum and silicon; S is a mixture of nitrogen and oxygen; and B is boron; and provided that R includes at least one element that is not included by Q.

2. The method of claim 1 wherein the Q, R, S and B are comprised by a compound having the stoichiometry $Q_xR_yS_z$ (B); wherein Q is a single element that is a refractory metal; and R is a single element selected from the group consisting of tungsten, aluminum and silicon; and wherein R is not the same element as Q.

3. The method of claim 1, wherein the method of forming a material comprises forming a portion of the material using a chemical vapor deposition process.

4. A method of forming a semiconductor circuit construction, comprising forming a material which comprises $Q_xR_yS_z$ (B); wherein Q is a single element selected from the group consisting of tantalum and tungsten; R is a single element selected from the group consisting of tungsten, aluminum and silicon; S is a single element of oxygen; and B is boron; and provided that R is not the same element as Q.

5. The method of claim 4, wherein the method of forming a material comprises forming a portion of the material using a chemical vapor deposition process.

6. A method of forming a semiconductor circuit construction, comprising forming a material which comprises $Q_xR_yS_z$ (B); wherein Q is a single element that is a refractory metal; R is a single element selected from the group consisting of tungsten and aluminum; S is a single element selected from the group consisting of nitrogen and oxygen; and B is boron; provided that R is not the same element as Q.

7. The method of claim 6 wherein z=1−(x+y).

8. The method of claim 6 wherein B is present in the $Q_xR_yS_z$ (B) at from about 0.01% to about 4% (atomic percent).

9. The method of claim 6 wherein Q is selected from the group consisting of titanium, tantalum and tungsten.

10. The method of claim 6, wherein the method of forming a material comprises forming a portion of the material using a chemical vapor deposition process.

11. A method of forming a capacitor construction, comprising:

forming an insulative material layer over a substrate;

forming a polysilicon interconnect extending through the insulative material and to an electrical node;

forming a first diffusion barrier layer against the polysilicon interconnect, the first barrier layer comprising $Q_xR_yS_z$; wherein Q is a single element that is a refractory metal; R is a single element selected from the group consisting of tungsten, aluminum and silicon; and S is a single element selected from the group consisting of nitrogen and oxygen; and provided that R is not the same element as Q;

exposing the first barrier layer to a nitrogen-containing plasma;

forming a first capacitor electrode separated from the polysilicon interconnect by the first barrier layer;

forming a dielectric layer proximate the first electrode; and forming a second capacitor electrode separated from the first electrode by the dielectric layer.

12. The method of claim 11, wherein the forming of a first diffusion barrier layer comprises forming the first diffusion barrier using a chemical vapor deposition process.

* * * * *